United States Patent [19]

Cole, Jr. et al.

[11] Patent Number: 5,182,188
[45] Date of Patent: Jan. 26, 1993

[54] METHOD OF DEVELOPING A SELF-DEVELOPING RESIST

[75] Inventors: Herbert S. Cole, Jr., Scotia; James W. Rose, Delmar; Renato Guida, Wynantskill; Yung S. Liu, Schenectady, all of N.Y.

[73] Assignee: General Electric Company, Schenectady, N.Y.

[21] Appl. No.: 546,230

[22] Filed: Jun. 29, 1990

[51] Int. Cl.⁵ .............................. G03F 7/36
[52] U.S. Cl. .................... 430/323; 430/945; 430/324; 430/322; 430/271; 250/316.1; 250/492.1; 219/121.65; 219/121.66; 219/121.7; 219/121.71; 427/555
[58] Field of Search ............ 430/945, 323, 324, 322; 250/316.1, 492.1; 219/121.65, 121.66, 121.7, 121.71; 427/53.1

[56] References Cited

U.S. PATENT DOCUMENTS

| | | | |
|---|---|---|---|
| 3,410,979 | 11/1968 | Larsson | 219/121.7 |
| 4,430,401 | 2/1984 | Wilkinson | 430/324 X |
| 4,877,644 | 10/1989 | Wu et al. | 427/53.1 |
| 5,035,918 | 7/1991 | Vyas | 427/53.1 |

*Primary Examiner*—Cynthia Hamilton
*Attorney, Agent, or Firm*—Marvin Snyder

[57] ABSTRACT

Self-developing photoresists are developed by exposing the substrate on which they are exposed to a light beam or other energy source which is absorbed by the substrate and which raises the substrate temperature to the thermal decomposition temperature of the overlying photoresist. This exposure may be done through the photoresist layer with a light beam having a frequency to which the photoresist is substantially transparent or may be done from the backside of the substrate using a light beam which is absorbed by the substrate itself if it is sufficiently thin, or by a thin layer disposed on a transparent substrate.

16 Claims, 8 Drawing Sheets

METHOD OF DEVELOPING A SELF-DEVELOPING RESIST

RELATED APPLICATION

This application is related to patent application Ser. No. 290,950, filed Dec. 28, 1988, now U.S. Pat. No. 5,084,311, "Electromagnetic Transducers and Method of Making Them", by U.S. Liu et al. which is incorporated herein by reference in its entirety.

BACKGROUND OF THE INVENTION

1. Field of the Invention

The present invention relates to the field of methods for patterning photoresists, and more particularly, to methods for patterning self-developing photoresists.

2. Background Information

Most of the photoresists used in the electronics industry require wet developing steps after having been exposed in a desired pattern in order to wash away the soluble portion of the resist. Such wet processing is undesirable in many applications.

Consequently, another class of photoresists known as self-developing photoresists was developed. These materials include such materials as poly(butene-1-sulfone) and nitrocellulose. These self-developing photoresists, when exposed to an appropriate energy source which may include ultraviolet light, excimer lasers, ion beams and electron beams, absorb the incident beam. The absorbed energy is sufficient to break chemical bonds and cause decomposition of the surface portion of the layer of self-developing photoresist into volatile species which are carried away from the substrate on which the photoresist is disposed. In the case of nitrocellulose, the volatile products reported by T. F. Deutsch and M. W. Geis in, "Self-Developing UV Photoresist Using Excimer Laser Exposure", *Journal of Applied Physics*, Vol. 54 (12), pp 7201-7204 (1983), include CO, $CO_2$, $H_2O$, $H_2$, $N_2$ and NO. Additional information about self-developing photoresists is provided in the paper "Self-Developing Resist with Submicrometer Resolution and Processing Stability", by M. W. Geis, et al., *Applied Physics Letters* Vol.43 (1), pp 74-76 (1983). Each of these papers is incorporated herein by reference in its entirety. When sufficient energy is directed to a particular portion of the photoresist, it is possible to remove the full depth of the photoresist to leave the underlying material exposed. Thereafter, process steps such as etching or plating may be performed which will be selective to the exposed portion of the substrate. Where etching is performed by a dry process such as plasma or reactive ion etching, the entire process may be carried out without the use of wet solutions. Alternatively, a wet etching or plating solution may be used as desired.

A problem which has existed in the photolithographic arts is the problem of producing a photolithographic pattern on the inside of a tubular member. As the inner diameter of the tubular member decreases, photolithographic provision of a pattern on the inner surface of that tubular member becomes increasingly difficult. The related patent application Ser. No. 290,950, entitled "Electromagnetic Transducers and Method of Making Them" by Y. S. Liu et al. discusses the needs for tubes of this type and the problems involved in their fabrication in greater detail and discloses one technique for producing patterns on the inside of a tubular member. Further improvements in methods of forming such patterns would be desirable.

While self-developing photoresists have provided increased versatility in processing for the electronics and other arts, further versatility is desirable.

OBJECTS OF THE INVENTION

A primary object of the present invention is to provide an alternative method of developing self-developing photoresists.

Another object of the present invention is to provide an efficient means of forming high resolution patterns on the insides of small tubes.

Another object of the present invention is to provide a method of developing a self-developing photoresist which does not directly expose the photoresist to actinic radiation.

Another object of the present invention is to provide a means of patterning a photoresist disposed on the inside of an opaque tubular member from outside the tubular member.

Another object of the present invention is to provide a technique for fabricating precision patterned conductors on the inside surface of a cylindrical or other hollow object.

Another object of the present invention is to provide a technique for making a precision coil-like structure on the inside of a tube for sensor applications.

SUMMARY OF THE INVENTION

The above and other objects which will become apparent from the specification as a whole, including the drawings, are accomplished in accordance with the present invention by locally heating the substrate on which the self-developing photoresist is disposed to transfer sufficient thermal energy to the self-developing photoresist to volatilize that resist in the pattern of the local heating of the substrate.

In accordance with one embodiment of the invention, light which is not absorbed by the self-developing photoresist is directed through that resist onto an underlying substrate which does absorb that frequency of light. This locally heats the substrate to above the thermal decomposition temperature of the self-developing photoresist which decomposes in a pattern determined by the pattern of illumination of the substrate. This removes the photoresist in a pattern determined by the pattern of illumination of the substrate.

In accordance with another embodiment of the present invention, the photoresist is disposed on a first side of a substrate and that substrate is locally heated by energy applied to the opposite side of the substrate to raise the temperature of the photoresist to its thermal decomposition temperature in a pattern which is determined by the pattern of exposure of the substrate to the incident beam. The substrate in this embodiment may preferably be transparent to the heating light except for a relatively thin film of material on which the photoresist is disposed. The frequency of light is chosen to be one which the material of that relatively thin film absorbs. A relatively thin film of material is used in order to maintain high resolution by limiting the rate of lateral transfer of thermal energy within the substrate.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
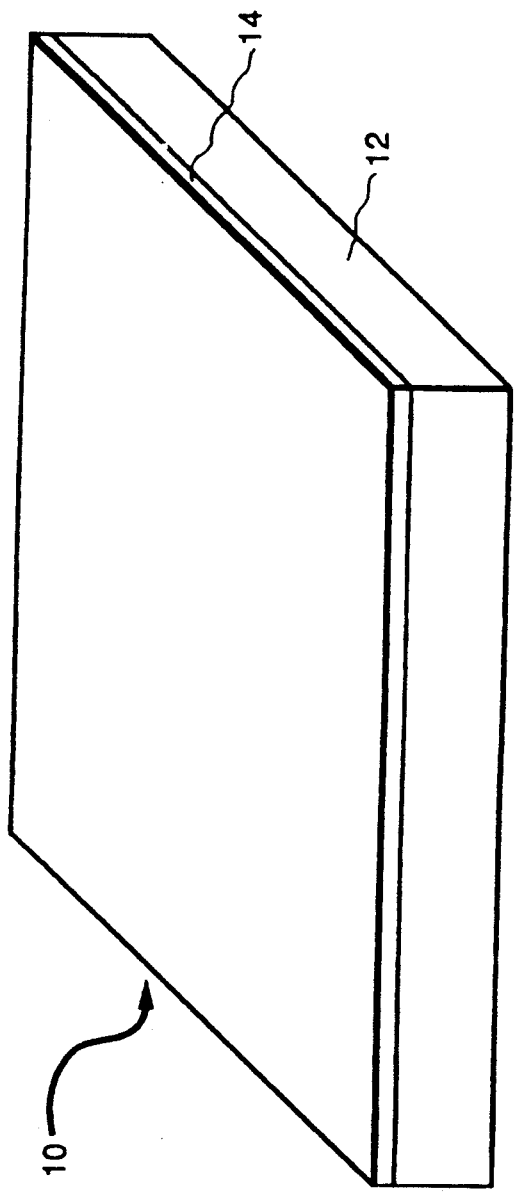
FIG. 1 is a perspective view of a substrate to be patterned in accordance with the present invention.
Figure 2:
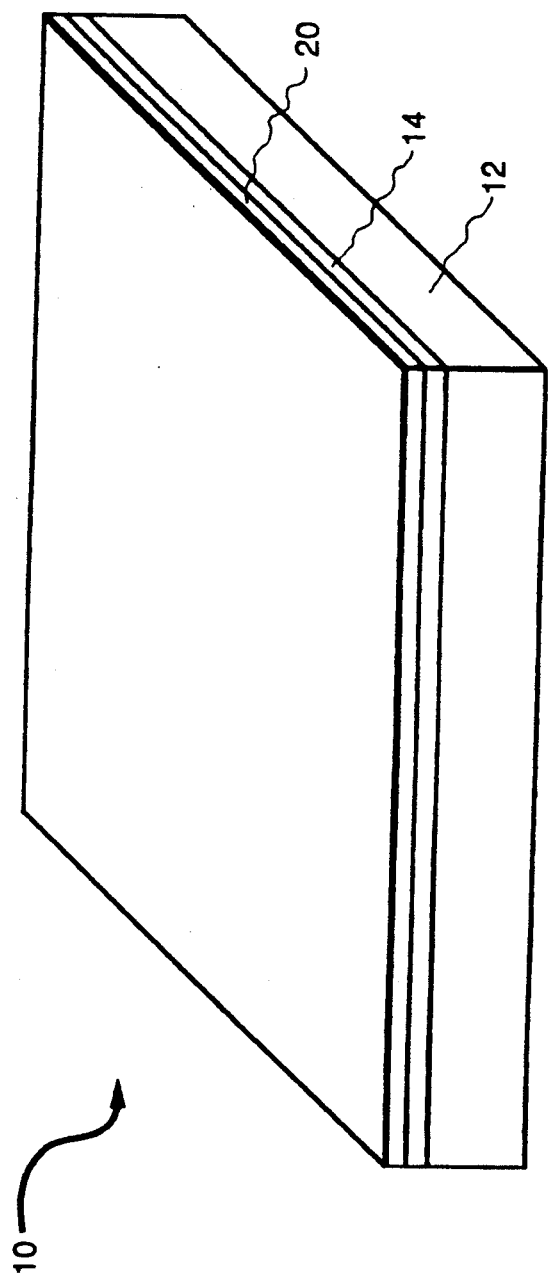
FIG. 2 illustrates the substrate of FIG. 1 after formation of a film of self-developing photoresist on the substrate.
Figure 3:
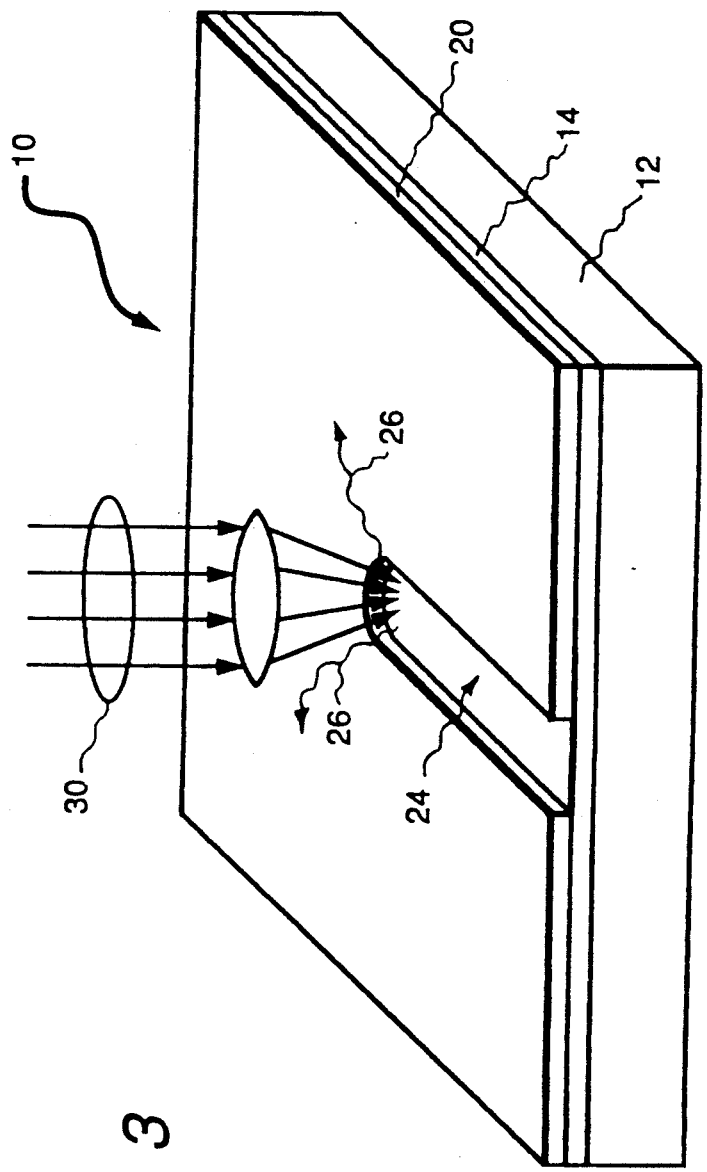
FIG. 3 is a schematic illustration of development of the photoresist by directing light to which the photoresist is substantially transparent through the photoresist onto the substrate.

In FIG. 1, a substrate 10 is illustrated in perspective view. The substrate 10 comprises a first portion or stratum 12 and a second portion or stratum 14 disposed on the portion 12. In accordance with one embodiment of the invention, the substrate 12 may be a transparent, electrically insulating material, while the layer 14 may be a In order to pattern the layer 14 either by selectively removing it or selectively adding to it by plating, it is desired to provide a patterned layer of photoresist on top of the layer 14. This is done by initially forming a layer 20 of a self-developing photoresist on top of the layer 14, as shown in FIG. 2. This self-developing photoresist may be poly(butene-1-sulfone), nitrocellulose or any other self-developing photoresist In accordance with one embodiment of the invention, the photoresist layer 20 of FIG. 2 is developed by directing a beam of light at a specific frequency to which that photoresist is substantially transparent through the photoresist onto the underlying layer 14, which absorbs the light at the specific frequency. By substantially transparent we mean that the photoresist exhibits a low enough absorbance for light of that wavelength that light will not sensitize (decompose) the resist by being absorbed in it. The beam of light is preferably a laser beam in order to provide sufficient energy density in a small spot to locally raise the temperature of the layer 14 to above the thermal decomposition temperature of the self-developing photoresist. This results in thermal decomposition of the photoresist into volatile fractions 26 which are carried away by the dynamics of the process. This process is illustrated in FIG. 3 where a beam of laser light 30 is being scanned across the body 12 to open a window area 24 in the photoresist 20. While a scanned laser beam is preferred for this process, other methods of exposure, including through a mask, may be employed. At the end of this development step, the surface of the layer 14 is exposed in the window 24 wherever the photoresist 20 was exposed to sufficient actinic radiation.

The absorbed energy density necessary for proper development of the photoresist can be effected by the thermal characteristics of the layer 14, thus, the layer 14 should be sufficiently thin and/or sufficiently thermally non-conductive that the heat generated by absorption of the light remains sufficiently localized to heat the photoresist to its decomposition temperature. If the layer 14 exhibits a combination of thickness and thermal conductivity which results in rapid spreading of the generated heat, a poor resolution development of the photoresist may result from a spreading of the heat broadening or blurring the line of development or a lack of development may result because the heat spreading prevented the photoresist from being heated to its decomposition temperature.

Figure 4:
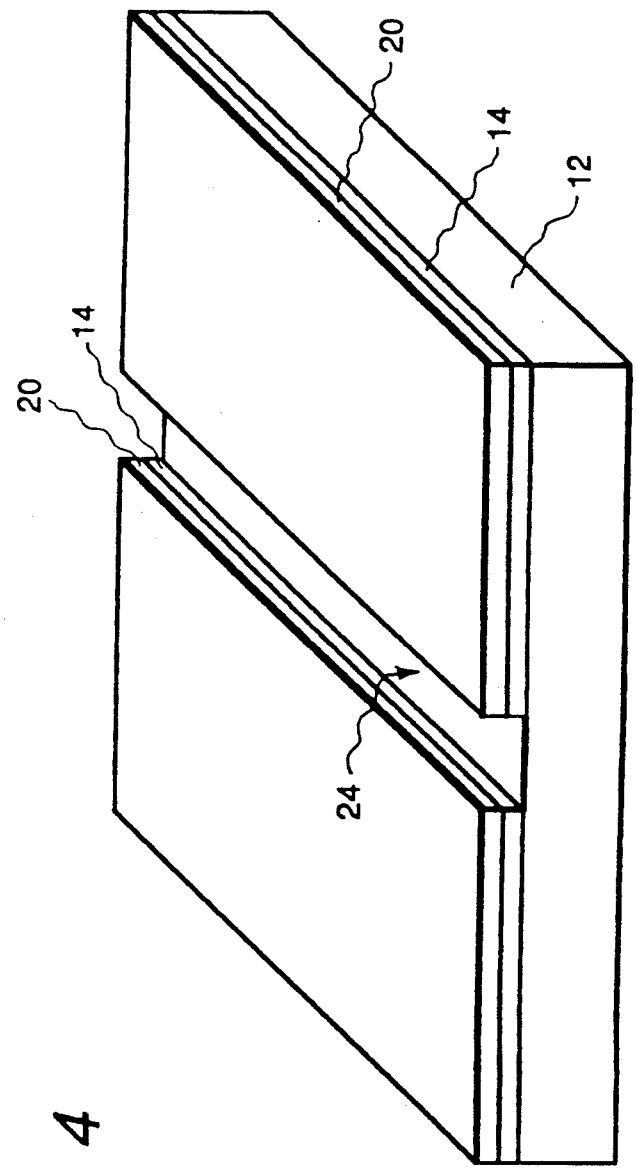
FIG. 4 is a schematic illustration of the structure after etching of the exposed portions of the substrate to remove a layer in the pattern of the development of the photoresist.
Figure 5:
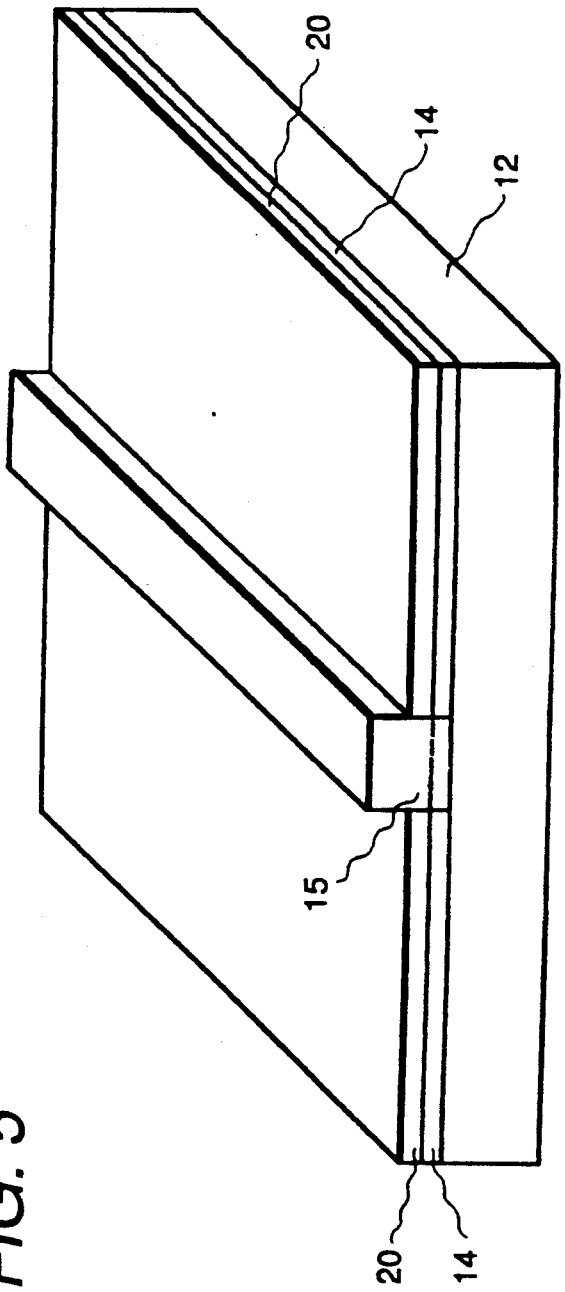
FIG. 5 is a schematic illustration of the structure after plating on the exposed portions of the substrate to form a thick layer of a metal in the pattern of the development of the photoresist.

The layer 14 may be patterned either by etching it to remove it to thereby leave only the other portions of the layer 14 present on the substrate as shown in FIG. 4, or that film may be electrolessly or electrolytically plated to make it thicker on exposed portions of the layer 14 as shown in FIG. 5 where the portion 15 of the layer 14 has been plated on top of the original layer 14. Subsequent to this plating step, the photoresist 20 may be removed from the remainder of the layer 14 and the relatively thin layer 14 may then be etched off the portion of the structure which was protected by the photoresist during the plating process, leaving only the portions of the layer 14/15 where the plated material 15 was deposited.

EXAMPLE 1

Figure 6:
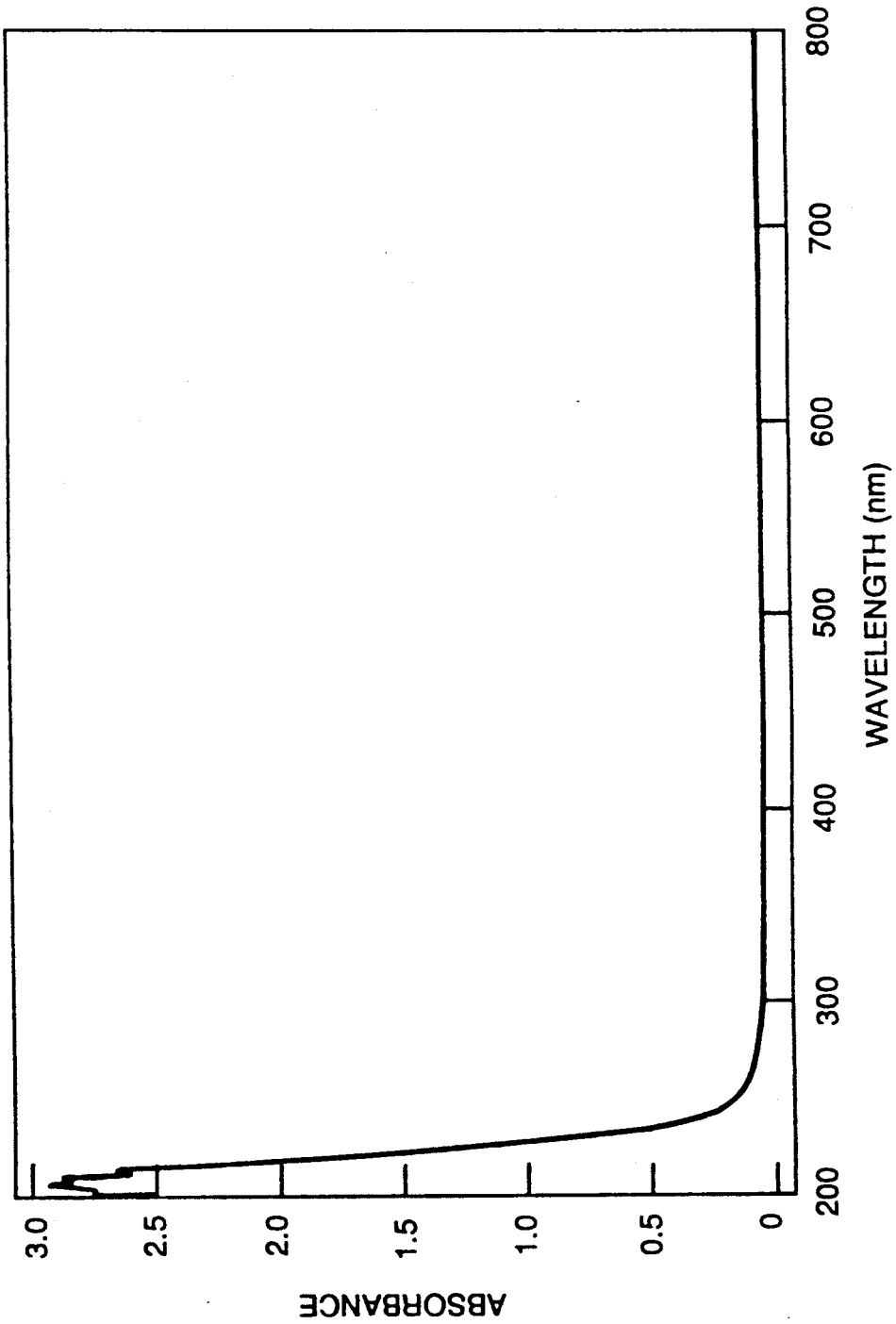
FIG. 6 is a graph of the absorbance of nitrocellulose self-developing photoresist as a function of the wavelength of the incident light.

Nitrocellulose in an amyl acetate solute was spin coated on a substrate consisting of a 25 μm thick KAPTON ® polyimide film which had been laminated to an alumina substrate. KAPTON ® polyimide is available from E. I. DuPont de Nemours. Kapton has very strong absorbance at 351 nm. The thickness of the nitrocellulose was about 0.5 μm. This sample was then scanned at a power level of 25 milliwatts and a scan speed between 4 and 20 millimeters per second with an argon/ion laser operating at 351 nm. The result was complete volatilization of the nitrocellulose in the exposed region. FIG. 6 is a graph of the absorbance of a 0.4 μm thick layer of nitrocellulose disposed on a quartz substrate as a function of light wavelength from 200 nm to 800 nm. As can be seen, the nitrocellulose is substantially transparent for wavelengths above 250 nm. Consequently, the volatilization of the nitrocellulose cannot have been from absorbance of the incident light by the nitrocellulose itself. Rather, local heating of the Kapton surface resulted in sufficient energy transfer to the nitrocellulose to thermally decompose the nitrocellulose layer. Window widths as narrow as 25 μm were achieved. We then immersed this sample in a palladium chloride catalyst which deposited a catalytic surface on the bare Kapton regions and on the nitrocellulose. We then removed the unirradiated portions of the nitrocellulose and the palladium chloride disposed thereon by rinsing in a solvent such as amyl acetate to leave palladium chloride catalysts only in the irradiated regions. Immersion in an electroless copper plating bath produced a copper layer in the irradiated region.

EXAMPLE 2

A thin layer of copper (~500 angstroms thick) was sputtered on a 25 μm thick Kapton film which had been laminated to an alumina substrate. Nitrocellulose was spin coated on the copper layer as described in Example 1. This sample was scanned at a power level of 140 mw at a scan speed of 0.5 to 4 mm/sec in order to completely volatilize the nitrocellulose layer in the irradiated portions of the structure. This higher power level and slower scan speed are a result of the lesser absorbance of copper at the 351 nm laser wavelength as compared to the absorbance of the Kapton layer. We then plated the sample in a copper electroplating bath to build up thicker copper lines in the irradiated regions from which the nitrocellulose had been removed. Plating thicknesses up to several microns were produced. The unexposed nitrocellulose was removed by immersion in a solvent such as amyl acetate and the thin 500 angstrom background copper layer was etched away to leave thick copper lines in the irradiated regions.

EXAMPLE 3

A 25 μm thick Kapton film was laminated on an alumina substrate and then had 0.1 μm of titanium deposited on it followed by the deposition of 1.5 μm of copper. A 1 μm thick layer of nitrocellulose was coated on top of the copper layer from an amyl acetate solution. The sample was then irradiated at 351 nm to volatilize the nitrocellulose in the irradiated regions. The sample was then immersed in succession in a copper etch and a titanium etch to remove the metals from the irradiated regions. The remaining nitrocellulose was then removed by immersion in methanol. Etched lines 2 mils wide were produced in this manner.

Figure 7:
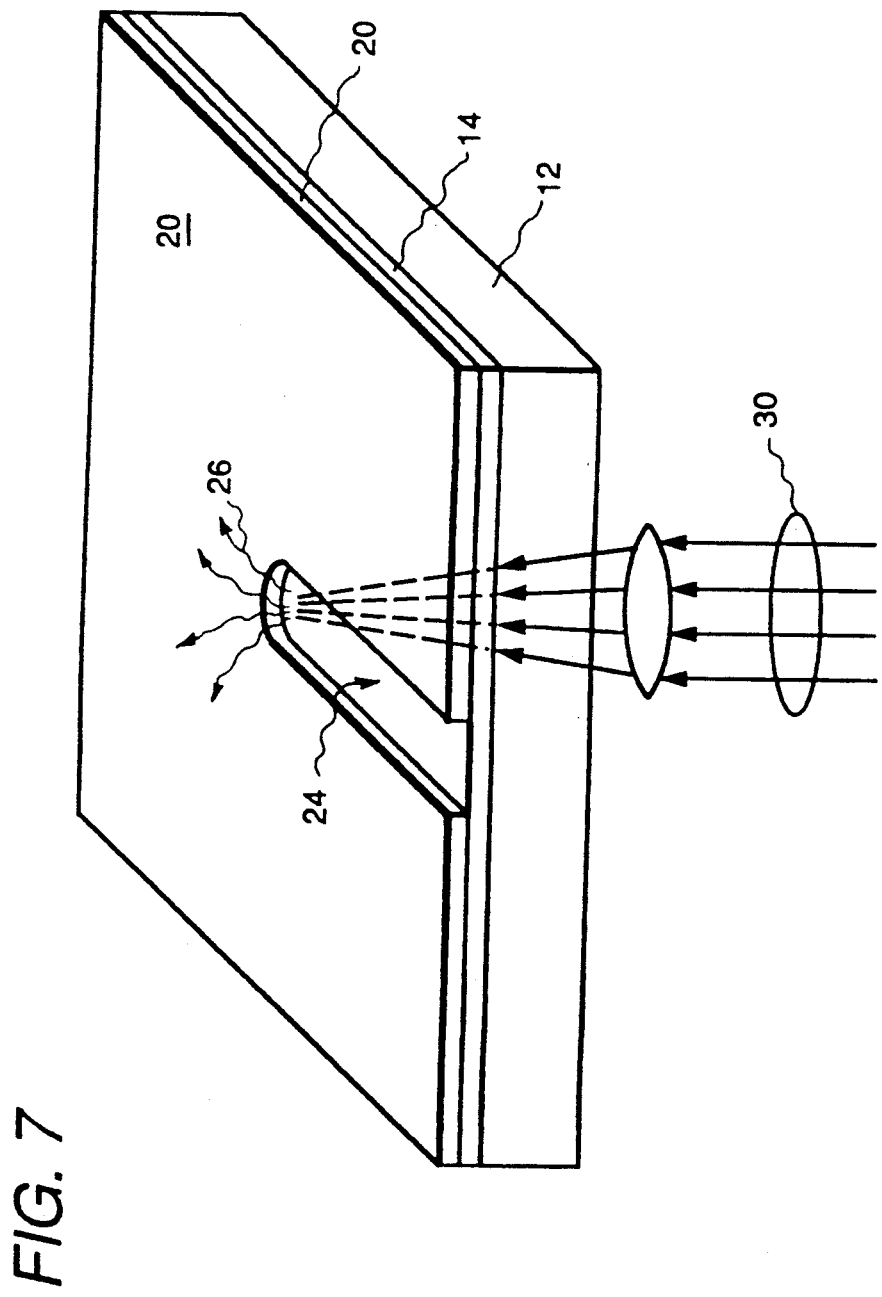
FIG. 7 is a schematic illustration of development of the photoresist of the FIG. 2 structure by directing light onto the back of the substrate.

The structure shown in FIG. 3 may also be developed by illumination of the substrate 12 from the backside with light to which the substrate 12 is transparent, but which is absorbed by the layer 14. This process is illustrated schematically in FIG. 7 wherein the heat produced in the layer 14 by absorption of the laser light beam 30 results in volatilization of the self-developing photoresist 20 to give off volatile species 26, thereby leaving an open window 24.

Figure 8:
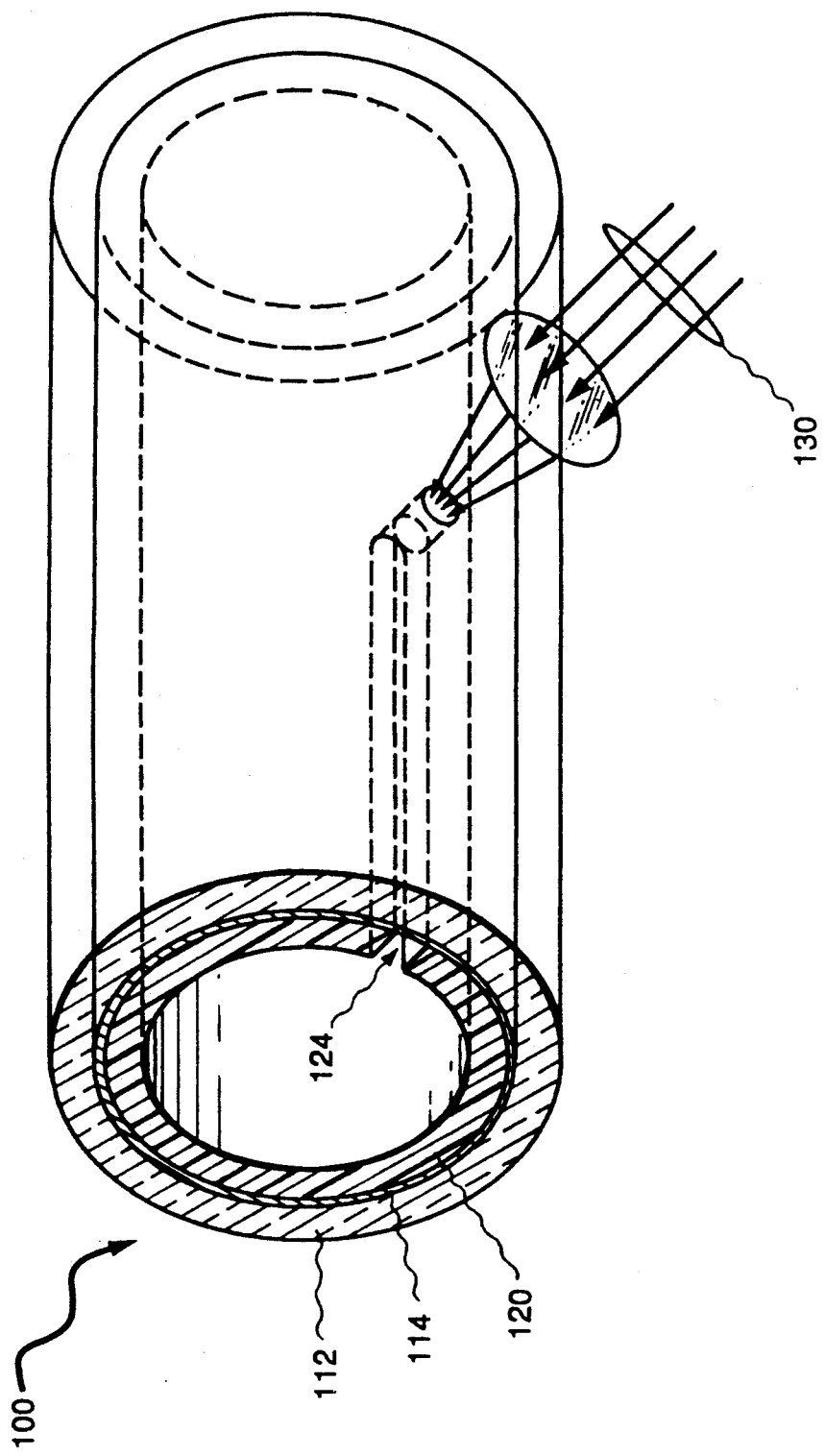
FIG. 8 is a schematic illustration of application of the present invention to the patterning of a layer disposed on the inside surface of a tube.

In FIG. 8, this method is illustrated being applied to the patterning of a film on the inside of a tube, illustrated generally at 100. The tube 100 may be a glass, plastic or quartz transparent outer tube 112 having an opaque layer 114 disposed on the inner surface thereof. The tube 112, itself, is preferably transparent. The overall or composite tube 100 is opaque because light cannot reach the inside of the tube through the sidewall of the tube because of the presence of the opaque layer 114. Thus, using prior art photoresist techniques, the layer 114 cannot be patterned by use of a photoresist disposed inside the tube on the inner surface of the layer 114 by exposure through the wall of the tube. In this embodiment the layer 114 is preferably metal, but may be other materials. A layer 120 of a self-developing photoresist is then formed on the inside of the tube by immersion of the tube in a solution of the photoresist material followed by drying of the film formed on the inside of the tube. Subsequently, the photoresist 120 is developed by directing a beam of light 130 through the transparent tube 112 onto the back surface of the film 114 which absorbs the light and transfers the thermal energy thus obtained to the photoresist 120 resulting in volatilization of the photoresist disposed on the portions of the film 114 which are exposed to the light 140. This results in the formation of a window 124 in the photoresist layer 120.

It will be noted that for backside development, there is no necessary relationship between the frequency of light used to heat the substrate and those frequencies of light to which the photoresist layer itself is transparent. This is because in this embodiment, the light used to heat the substrate does not pass through the nitrocellulose self-developing photoresist layer.

Following completion of this exposure process, the exposed portions of the film 114 may be removed by etching or may be electrolessly or electrolytically plated to provide a thicker layer in the windows 124. After formation of a sufficiently thick line in the windows 124, the photoresist 120 is removed by dissolving it in an appropriate solvent. If the windows have been plated to provide thicker metal, the thin background layer 114 is then etched away to leave the thick lines in the pattern defined by the window 124.

EXAMPLE 4

A quartz tube which is 2 mm in diameter was metallized on its inner surface with a thin layer of copper using a chemical vapor deposition (CVD) process. A layer of nitrocellulose was coated from amyl acetate solution over this layer of copper. A laser beam at 351 nm was directed through the outer, transparent quartz portion of the tube causing localized heating of the copper surface which absorbed the light beam. By appropriate adjustment of the laser power, the spot size and the duration of the spot's dwell on a particular portion of the layer 114, the temperature of the metallized layer was brought to the critical temperature for thermal decomposition and volatilization of the nitrocellulose in the irradiated areas. The exposed metal areas could then be etched or plated and the remaining resist stripped.

It will be recognized that in Example 4, a glass tube may be substituted for the quartz tube provided that a frequency of light is employed to which that glass tube is sufficiently transparent and to which the metal film on the inner surface of that glass tube is sufficiently absorbing to provide the temperature rise to thermally decompose the nitrocellulose photoresist.

This method of developing a self-developing photoresist has substantial application in the electronic arts since it can provide high resolution without a requirement that a light frequency which is absorbed by the photoresist be used. In particular, the ability to develop the photoresist by exposure of the opposite side of an opaque layer is highly advantageous in a number of applications. For thin films of copper up to about 1 μm thick, there is very little heat transfer in the plane of the film. Consequently, a high resolution line can be produced even by the backside exposure process described. This is because for these thin films, essentially all of the heat stays in the localized region and a substantial portion of it is transferred directly to the nitrocellulose or other self-developing photoresist disposed thereover. As has been discussed, this is particularly useful in forming patterns on the inside of small diameter tubes or other hollow objects.

In a similar manner, a Kapton layer may be exposed from behind to remove a photoresist layer on its front surface, provided the Kapton layer is sufficiently thin and the exposure energy is kept below the energy level at which the Kapton itself will ablate or a frequency is used to which Kapton itself is transparent.

In general, the pattern of development of the self-developing resist matches that of the heating of the substrate which in turn conforms to the pattern of illumination of the substrate. The window formed in the resist can be either narrower than or wider than the exposing beam, depending on the applied energy density. It is for this reason that we characterize the pattern of development as being determined by the pattern of illumination rather than as being the same as that pattern.

With a nitrocellulose self-developing photoresist, a thickness up to about 2 μm provides good results in accordance with this process. Unfortunately, photoresist layers which are substantially thicker than that are less effective because the upper portions of the photoresist film do not heat fast enough to decompose along with the portions of the photoresist adjacent the absorbing interface. As a consequence, the upper portion of the photoresist layer tends to be torn from the remainder of the photoresist layer as result of the buildup of pressure thereunder due to the decomposition of the portion of the photoresist layer adjacent the substrate. Alternatively, for sufficiently thick layers, the buildup of pressure may lead to separation of the photoresist layer from the substrate as a localized bubble rather than rupture of the upper portion of the photoresist layer.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of patterning a self-developing photoresist comprising:
    providing a substrate of layered configuration including a first sublayer and a second sublayer disposed on said first sublayer, said first sublayer being a better thermal insulator than said second sublayer, said second sublayer being absorptive of a frequency of light to which said self-developing photoresist is substantially transparent, and said second sublayer being sufficiently thin that heat generated in said second sublayer is only insignificantly transmitted laterally in said second sublayer;
    depositing said self-developing photoresist on said second sublayer of said substrate;
    developing said self-developing photoresist by directing light through said photoresist onto said second sublayer of said substrate, said light being at the frequency to which said self-developing photoresist is substantially transparent and at which said second sublayer of said substrate is sufficiently absorbing to be heated by said light, under conditions which result in sufficient heat generation in said second sublayer of said substrate to volatilize said self-developing photoresist in a pattern determined by the pattern of illumination of said substrate.

2. The method recited in claim 1 wherein:
    said second sublayer is a thin film less than about 1 μm thick.

3. The method recited in claim 2 wherein:
    said film is a metal.

4. The method recited in claim 1 wherein:
    said self-developing photoresist is selected from the group consisting of poly(butene-1-sulfone) and nitrocellulose.

5. A method of patterning a self-developing photoresist comprising:
    depositing said self-developing photoresist on a first surface of a substrate;
    directing light of a given frequency at a second surface of said substrate, said given frequency being one at which said substrate is sufficiently absorbing to be heated by said light to a temperature sufficient to volatilize said self-developing photoresist in a pattern determined by the pattern of illumination of said substrate.

6. The method recited in claim 5 wherein said substrate has a layered configuration and comprises:
    a first sublayer which is transparent to said given frequency of light; and
    a second sublayer disposed on said first sublayer, said second sublayer being adsorptive of said given frequency of light;
    said self-developing photoresist being disposed on said second sublayer.

7. The method recited in claim 6 wherein:
    said light is directed through said transparent first sublayer onto said adsorptive second sublayer.

8. The method recited in claim 6 wherein:
    said second sublayer is sufficiently thin that heat generated in said second sublayer is only insignificantly transmitted laterally in said second sublayer.

9. The method recited in claim 8 wherein:
    said second sublayer is a thin film less than about 1 μm thick.

10. The method recited in claim 9 wherein:
    said thin film is a metal.

11. A method of forming a pattern on the inside of a hollow opaque body comprising the steps of:
    (a) coating the inside of said body with a layer of self-developing photoresist;
    (b) directing a beam of light onto the exterior surface of said body in a pattern determined by the pattern to be formed on the inside of said body, said beam of light having a frequency which said body absorbs and having sufficient energy density to heat the inner surface of said body to the thermal decomposition temperature of said self-developing photoresist to volatilize the photoresist disposed on the illuminated portions of the body;
    (c) performing a process which affects the characteristics of the inner surface of said body in the areas which were exposed by the volatilization of said self-developing photoresist.

12. The method recited in claim 11 wherein:
    said process performed in step (c) is an additive process.

13. The method recited in claim 12 wherein:
    said additive process comprises plating.

14. The method recited in claim 11 wherein:
    said process performed in step (c) is a subtractive process.

15. The method recited in claim 14 wherein:
    said subtractive process comprises etching.

16. The method recited in claim 11 wherein said opaque body comprises:
    an outer portion which is substantially transparent to said beam of light; and
    an inner portion which is adsorptive of said beam of light.

* * * * *